(12) United States Patent
Colgan et al.

(10) Patent No.: US 8,600,202 B2
(45) Date of Patent: Dec. 3, 2013

(54) PROCESS FOR ENHANCED 3D INTEGRATION AND STRUCTURES GENERATED USING THE SAME

(75) Inventors: Evan G. Colgan, Armonk, NY (US); Sampath Purushothaman, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/585,494

(22) Filed: Aug. 14, 2012

(65) Prior Publication Data

US 2012/0314994 A1 Dec. 13, 2012

Related U.S. Application Data

(62) Division of application No. 12/698,529, filed on Feb. 2, 2010, now Pat. No. 8,330,262.

(51) Int. Cl.
   *G02B 6/12* (2006.01)

(52) U.S. Cl.
   USPC .......................................................... 385/14

(58) Field of Classification Search
   USPC .......................................................... 385/14
   See application file for complete search history.

(56) References Cited

U.S. PATENT DOCUMENTS

| | | |
|---|---|---|
| 4,525,921 A | 7/1985 | Carson et al. |
| 4,646,128 A | 2/1987 | Carson et al. |
| 4,706,166 A | 11/1987 | Go |
| 5,104,820 A | 4/1992 | Go et al. |
| 5,347,428 A | 9/1994 | Carson et al. |
| 5,362,986 A | 11/1994 | Angiulli et al. |
| 5,432,729 A | 7/1995 | Carson et al. |
| 5,502,667 A | 3/1996 | Bertin et al. |
| 5,517,754 A | 5/1996 | Beilstein, Jr. et al. |
| 5,561,622 A | 10/1996 | Bertin et al. |
| 5,563,086 A | 10/1996 | Bertin et al. |
| 5,702,984 A | 12/1997 | Bertin et al. |
| 5,804,004 A | 9/1998 | Tuckerman et al. |
| 5,818,107 A | 10/1998 | Pierson et al. |
| 6,033,931 A | 3/2000 | Hoflman et al. |
| 6,059,939 A | 5/2000 | Pierson et al. |
| 6,085,411 A | 7/2000 | Stewart et al. |
| 6,090,633 A | 7/2000 | Yu et al. |
| 6,156,165 A | 12/2000 | Pierson et al. |

(Continued)

OTHER PUBLICATIONS

Kogge, Peter et, al. *Air Force Research Laboratory, IPTO*; "ExaScale Computing Study . . . ;" pp. 1, 159, 161 (Sep. 28, 2008).

*Primary Examiner* — Uyen Chau N Le
*Assistant Examiner* — Kajli Prince
(74) *Attorney, Agent, or Firm* — Robert J. Eichelburg; The Law Offices of Robert J. Eichelburg (57) ABSTRACT

An enhanced 3D integration structure comprises a logic microprocessor chip bonded to a collection of vertically stacked memory slices and an optional set of outer vertical slices comprising optoelectronic devices. Such a device enables both high memory content in close proximity to the logic circuits and a high bandwidth for logic to memory communication. Additionally, the provision of optoelectronic devices in the outer slices of the vertical slice stack enables high bandwidth direct communication between logic processor chips on adjacent enhanced 3D modules mounted next to each other or on adjacent packaging substrates. A method to fabricate such structures comprises using a template assembly which enables wafer format processing of vertical slice stacks.

2 Claims, 8 Drawing Sheets (56) References Cited

U.S. PATENT DOCUMENTS

| | | |
|---|---|---|
| 6,261,452 B1 | 7/2001 | Mayer |
| 6,329,609 B1 | 12/2001 | Kaja et al. |
| 6,355,501 B1 | 3/2002 | Fung et al. |
| 6,388,317 B1 | 5/2002 | Reese |
| 6,444,560 B1 | 9/2002 | Pogge et al. |
| 6,473,308 B2 | 10/2002 | Forthun |
| 6,599,778 B2 | 7/2003 | Pogge et al. |
| 6,600,224 B1 | 7/2003 | Farquhar et al. |
| 6,640,021 B2 | 10/2003 | Pogge et al. |
| 6,678,949 B2 | 1/2004 | Prasad et al. |
| 6,717,061 B2 | 4/2004 | Yamaguchi et al. |
| 6,737,297 B2 | 5/2004 | Pogge et al. |
| 6,821,826 B1 | 11/2004 | Chan et al. |
| 6,835,589 B2 | 12/2004 | Pogge et al. |
| 6,856,025 B2 | 2/2005 | Pogge et al. |
| 6,864,165 B1 | 3/2005 | Pogge et al. |
| 6,908,792 B2 | 6/2005 | Bruce et al. |
| 7,005,730 B2 | 2/2006 | Vermaet et al. |
| 7,049,216 B2 | 5/2006 | Rinne |
| 7,049,697 B2 | 5/2006 | Pogge et al. |
| 7,056,813 B2 | 6/2006 | Morrow et al. |
| 7,071,031 B2 | 7/2006 | Pogge et al. |
| 7,071,546 B2 | 7/2006 | Fey et al. |
| 7,132,754 B1 | 11/2006 | Schmidt |
| 7,151,009 B2 | 12/2006 | Kim et al. |
| 7,170,164 B2 | 1/2007 | Chen et al. |
| 7,193,304 B2 | 3/2007 | Kuo et al. |
| 7,230,334 B2 | 6/2007 | Andry et al. |
| 7,307,003 B2 | 12/2007 | Reif et al. |
| 7,312,487 B2 | 12/2007 | Alam et al. |
| 7,355,277 B2 | 4/2008 | Myers et al. |
| 2002/0034068 A1* | 3/2002 | Weber et al. ................ 361/790 |
| 2011/0170266 A1 | 7/2011 | Haensch et al. |

* cited by examiner

| SLICE HEIGHT (mm) | VERTICAL MEMORY SLICE THICKNESS (mm) | | | | | | |
|---|---|---|---|---|---|---|---|
| | 0.100 | 0.200 | 0.300 | 0.400 | 0.500 | 0.667 | 0.735 |
| 1.0 | 10.0 | 5.0 | 3.3 | 2.5 | 2.0 | 1.5 | 1.4 |
| 2.0 | 20.0 | 10.0 | 6.7 | 5.0 | 4.0 | 3.0 | 2.7 |
| 3.0 | 30.0 | 15.0 | 10.0 | 7.5 | 6.0 | 4.4 | 4.0 |
| 4.0 | 40.0 | 20.0 | 13.4 | 10.0 | 8.0 | 6.0 | 5.4 |
| 5.0 | 50.0 | 25.0 | 16.6 | 12.5 | 10.0 | 7.4 | 6.8 |
| 6.0 | 60.0 | 30.0 | 20.0 | 15.0 | 12.0 | 9.0 | 8.4 |

*FIG. 3*

| WIRE PITCH @90 DEGREE TURN (mm) | VERTICAL SI SLICE THICKNESS (mm) | | | | | | | |
|---|---|---|---|---|---|---|---|---|
| | 0.100 | 0.200 | 0.300 | 0.400 | 0.500 | 0.667 | 0.735 |
| 0.005 | 2000 | 1000 | 667 | 500 | 394 | 300 | 272 |
| 0.010 | 1000 | 500 | 333 | 250 | 197 | 150 | 136 |
| 0.015 | 667 | 333 | 222 | 167 | 131 | 100 | 91 |
| 0.020 | 500 | 250 | 167 | 125 | 98 | 75 | 68 |
| 0.025 | 400 | 200 | 133 | 100 | 79 | 60 | 54 |
| 0.030 | 333 | 167 | 111 | 83 | 66 | 50 | 45 |
| 0.035 | 286 | 143 | 95 | 71 | 56 | 43 | 39 |
| 0.040 | 250 | 125 | 83 | 63 | 49 | 37 | 34 |
| 0.050 | 200 | 100 | 67 | 50 | 39 | 30 | 27 |

PROCESS FOR ENHANCED 3D INTEGRATION AND STRUCTURES GENERATED USING THE SAME

RELATED APPLICATIONS

This application is a Divisional Application of parent application Ser. No. 12/698,529 filed Feb. 2, 2010 and incorporated herein in its entirety

STATEMENT PURSUANT TO 37 C.F.R. §1.77 (B) (3) REGARDING FEDERALLY SPONSORED RESEARCH OR DEVELOPMENT

This invention was made under a federally sponsored research and development agreement, H98230-08-C-1468, "CYCLOPS II ARCHITECTURE and ENGINEERING STUDY."

FIELD OF THE INVENTION

The field of the invention comprises integrated electronic 3D system devices and a process for building integrated 3D system devices that enables a higher level of system integration than possible with current 3D integration processes and structures, but does not employ through silicon vias.

BACKGROUND OF THE INVENTION AND RELATED ART

Various processes and structures described in the related art address high level system integration such as Hoffman, et al., U.S. Pat. No. 6,033,931, one of a class of so-called "cube patents." Hoffman, et al. discloses a three-dimensional microchip circuit assembly process that employs a three-layer dry film sandwich to prepare a stacked circuit cube. Bertin, et al. U.S. Pat. No. 5,563,086 discloses an integrated memory cube structure and method of fabrication in which stacked semiconductor memory chips are integrated by a controlling logic chip such that a more powerful memory architecture is defined with the functional appearance of a single higher level memory chip. Carson, et al., U.S. Pat. No. 5,347,428 describes a computer module in which a stack of glued together IC memory chips is structurally integrated with an IC microprocessor chip. Go, et al. U.S. Pat. No. 5,104,820 discloses a method of fabricating electronic circuitry units containing stacked IC layers having lead rerouting. Carson, et al., U.S. Pat. No. 4,646,128 discloses high-density electronic processing packages and structures and methods for manufacturing them.

The so-called "cube" structures described in these references is a result of a procedure also known in the art as chip stacking, but this has several drawbacks that include inter alia; edge connection architecture which leads to signal delay, lower input/output (I/O) density, difficulty in powering the system through edge connections, and difficulty in cooling the system for high power use.

Scaling of complementary metal-oxide-semiconductors (CMOS) transistor devices to smaller and smaller dimensions to enable larger circuit density is running into challenges in that the performance of such ultra small devices is not scaling favorably due to short channel effects in the device behavior, the difficulty in scaling channel strain induced mobility enhancements and the like. Additionally, with the increased logic circuit density, the demands for memory accessible by logic circuits with minimal delay and memory bandwidth to access a large segment of the memory at a given time are becoming paramount to achieving peak performance. This in turn drives two requirements. First, additional memory needs to be located close to the logic circuitry with fast access time and second, high bandwidth interconnects are required for the logic circuits to send and retrieve information from these memory cells on the chip thus driving a huge increase in interconnect density and speed.

In this regard, 3D integration (3DI) which represents a process for device integration at a system level is emerging as an option to bring heterogeneous devices together in close proximity so that they function as a homogeneous device. 3DI differs from the traditional 2D planar back-end-of-line (BEOL) integration in that 3DI adds an additional dimension, (Z) integration, which allows more devices from different sources, functionalities, and types to be integrated in a close proximity to form a single assembly which can function as an integrated system.

The 3DI approach allows more device content (memory for example) and fast access time to the various devices (shorter signal travel distance enabled through connections in the Z-direction) than the traditional 2D planar structure restricted to X-Y wiring only. This is very beneficial for system level performance since the accessible amount of memory within one clock-cycle distance can be greatly enhanced by shortening the physical distance between the processor and memory elements of the system. A clock-cycle distance is the distance that the signal can cover within one device clock-cycle. For today's devices running at over several GHz speed this distance is reduced to only several millimeters. In a 2D configuration more and more device contents have to be placed outside this distance. Thus more clock-cycles are needed to access them during complex operations requiring a large amount of memory to be retrieved, processed, and stored back. This in turn translates into slower data processing speed at the system level although the individual elements of the system—processor and memory—are capable of higher speed of operation.

3D integration places the additional contents such as memory cells in the third dimension (by Z-stacking), and therefore increases the amount of accessible device functionality within the critical single clock-cycle zone. In addition to more memory content within the clock-cycle zone, 3DI also allows additional and disparate components such as SiGe, III-V devices, optoelectronics, MEMS and the like to be integrated as part of the system on a single assembly level. As these components are typically fabricated on different substrates using processes which may be incompatible with currently practiced silicon CMOS processes, they cannot be embedded into a silicon chip using 2D process methodologies. Thus such components tend to be integrated with CMOS using chip carriers or circuit boards as a means to interconnect them which can limit the ability to fully utilize the capability of the components.

Of the process format, 301 can be further separated into wire bonded chip stacks and through silicon via (TSV) based chip stacks. The wire bonded 3DI mainly focuses on lower density and count input/output (I/O). Typically dozens to hundreds of I/O's, and are used for systems where high contents and lower power within a given footprint are the key considerations for the consumer markets. These typically use wire bond connections at the periphery of the stacked wafers to achieve I/O connections. The TSV 3DI on the other hand tends to focus on high performance systems where I/O count is over several thousands and high speed (>2 GHz) processors are used where the system clock-distance becomes a key requirement. In this high performance application space, through Si via connections become a dominant factor by enabling shorter vertical connections to reduce distance between the devices For most chip-level 3DI, chip stacking is used along with the provision of device I/O fanned out to edge leads. The edge leads are then connected with wire bonds to edge pads on a logic chip of a larger size placed at the bottom of the chip stack. Due to such a connection scheme, chip-level connection typically enables more content than 2D but the access time between devices is limited by inductive and capacitive delays associated with the bonded wire connections and going to the edges of the chips. Also it is difficult to conveniently deliver power to the various chips in the stacked assembly.

3DI with through-Si-via connection allows the integration at wafer level and offers a higher I/O density and a Z-connection with reduced parasitics compared to wire bond connections. Through-Si-via processes for 3DI can also be further separated into via-first and via last approaches. Via-first as the name implies comprises embedding the through vias in the parent wafer(s) before devices are fabricated. This normally allows a higher wiring content since the I/O's do not go through the top device structure directly thus allowing more area for wiring. The level to level z-connections are typically done between capture pads on the through vias using metal compression bonds (using metals such as Cu-Cu, no solder, no adhesive), micro-C4 joining (solder, no adhesive), or transfer joining (T&J, metal compression bond supplemented by adhesive joining for strength referred to as hybrid bonding). Via-first connections typically enable an I/O density with pitch as small as about 25 to about 50 microns (um). The assembly methods described above can also be used for individual chips, and are not restricted to just wafer level 3DI schemes.

For 3DI with via-last approach, the wiring density is typically reduced relative to the via first approach due to the use of some of the wiring channels by the thru-vias which need to thread through the entire device stack to connect devices. However, since the thru-vias can be defined lithographically and filled, they are not limited by the 3D layer joining tolerances as in the case of the via first approach, via-last normally can have a higher via-density (under about 5 um pitch) than via-first approach (about 25 to about 50 um pitch).

In all 3DI integration schemes mentioned above, the cooling of the system is typically a difficult issue to resolve. The tighter stacking of devices generates more heat per unit volume but with reduced heat dissipation. Provision of microchannels for cooling on the bulk silicon substrate of the assembly in the final 3DI stack can provide enhanced cooling but cannot completely achieve an effective cooling of upper layers when many device layers are stacked in the 3D system. Thus for both chip stacking and through-Si connection approaches, the heating power density increases as the number of 3DI devices increase. This limits the number of 3DI devices stackable into a system as the heat dissipation becomes a road block for further 3D content increase.

Another issue associated with 3DI is the thru-Si connection electro-static discharge (ESD) protection requirements. In any device design, an ESD protection circuitry is provided and linked to an I/O net. This protects sensitive devices from manufacturing process induced ESD. Since each wafer in a 3DI stack needs ESD protection, the final 3DI circuits will have to have a total ESD circuit allocation as large as the sum of all the devices in the 3DI structure. This can be a large load as the number of devices increases and requires a large driver to access the 3DI circuits which could significantly slow them down.

In general, the current thru-Si 3D wafer stacking processes and resultant devices present many processing related issues, e.g., thin Si construction (<100 um) requires stacking wafers one at a time to allow thru-Si vias; it is difficult to make the via less than 5 um in size and 10 um in pitch in devices employing Cu; thru-Si vias can be made from W but W has a higher resistivity than Cu; thru-Si vias pass through the bonding interface making bonding defects difficult to control; wafer stacks are limited due to bonding thermal cycles; the process is complex and introduces via yield and wafer yield issues; manufacturing involves long process cycles; wafer level distortions are introduced. Accommodation of thru-Si vias requires significant changes in the lay out of processor and memory chips in addition to leading to loss of useable silicon area available for device circuits. The chip cube approaches known in the current art which avoid thru-Si via related concerns, however are limited in their ability to provide a high bandwidth for data communication in and out of the structure and have high parasitics as they depend on edge leads or wire bonds formed after assembly.

SUMMARY OF THE INVENTION

The present invention provides structures, articles of manufacture and processes that address these difficulties and needs, to not only provide advantages over the related art, but also to substantially obviate one or more of the foregoing and other limitations and disadvantages of the related art by providing processes for enhanced 3D integration and structures generated by these processes.

Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the invention comprises inter alia, an integration technique that enables the increase of the accessible system memory within one processor clock-cycle by 10 fold or more as compared to a 2D system. Such an increase in memory content is in excess of the few fold increase possible with conventional 3DI stacking of memory wafers/chips on processor base wafer/chip.

The object of the present invention is to further tackle and solve the above mentioned limitations and disadvantages of the TSV based 3DI approaches, and comprises an enhanced TSV-free 3DI approach denoted as "4D Integration" (4DI for short).

Many of the enhancements are described in the co-pending application YOR920090121US1 by some of the present authors attached herewith for reference. The present application describes a simple method to produce the 4DI assembly using wafer type substrate format processing. Additionally, a particular 4DI structural embodiment which uniquely enables the integration of optical data communication capability between 4DI modules is also described.

These and other aspects of the present invention are delineated in further detail using the following illustrative drawings and the subsequent descriptions.

BRIEF DESCRIPTION OF THE DRAWINGS

The accompanying drawings also set out the invention and are incorporated in and constitute a part of the disclosure along with this specification and are included to illustrate various embodiments of the invention and together with this written description also serve to explain the principles of the invention. These drawings, however, are not necessarily drawn to scale.

In the drawings.

DETAILED DESCRIPTION

Figure 1:
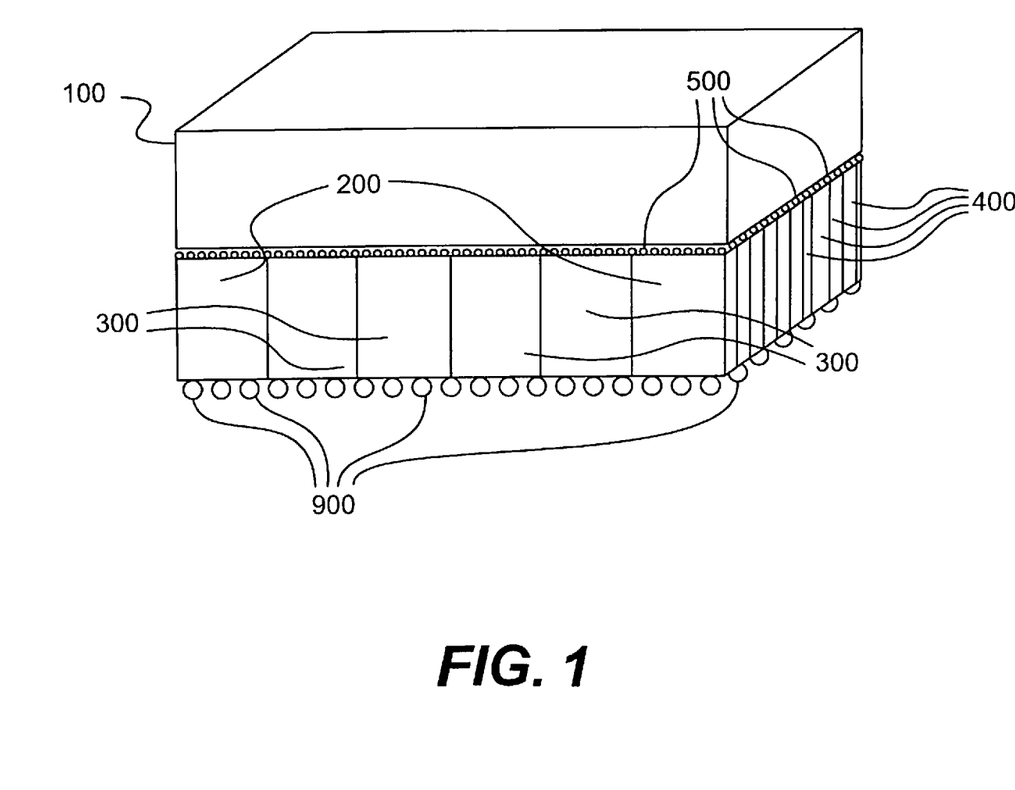
FIG. 1 comprises an isometric view of the inventive 4DI module showing a processor chip attached atop a vertical stack of device slices bonded together with an adhesive along with C4 input output pads at the bottom.

FIG. 1 shows a schematic isometric view of a 4DI final assembly comprising a logic microprocessor chip 100 attached to a collection of vertically stacked slices 200 and 300 through microjoints 500. Slices 200 and 300 are typically slices from memory wafers but in one later embodiment the end slices 200 are chosen to be slices from an optoelectronic device wafers. The view also shows the metal wiring lines 400 running along the vertical face of one of the end slices 200 and these lines are connected to circuitry present in the slice. Although the lines are shown only on this end slice for clarity, such lines are provided on the active surface of all of the slices 200 and 300. At the bottom of the slice stack an array of C4 solder joints 900 are shown which enable attaching the whole 4DI assembly to a packaging substrate (not shown). Microjoints 500 and C4 solder joints 900 connect to metallization patterns (omitted in FIG. 1 for clarity) located on the top and bottom surfaces of the slice assembly respectively. These metallization patterns in turn are connected to the ends of the slice surface wiring lines 400 thus enabling electrical connections between the logic microprocessor 100, circuitry in slices 200 and 300, and the packaging substrate (not shown in FIG. 1 for clarity). Although only six vertical slices are shown in FIG. 1 for simplicity of illustrating the concept, as will be evident from the subsequent description, any number of vertical slices can be present in the 4DI structure depending upon the area of the microprocessor chip 100 and the thickness of the individual vertical slices 200 and 300. It should be additionally noted that the adhesive layer used to bond the vertical slices to each other is not shown in FIG. 1, again for clarity but will be described in the details of the next figure.

Figure 2:
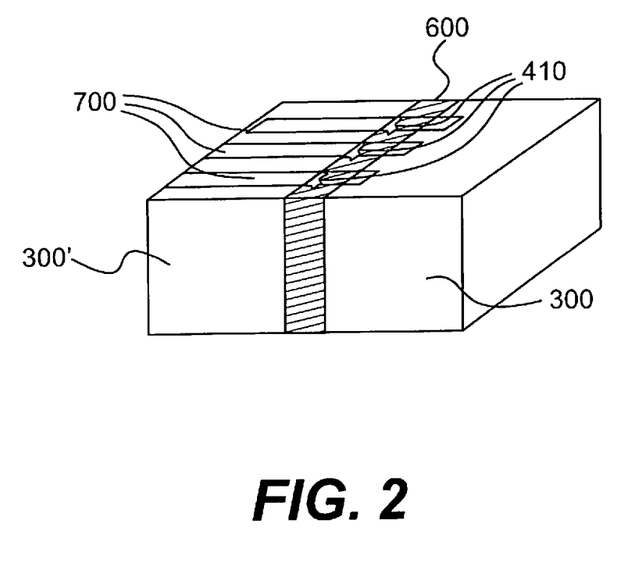
FIG. 2 comprises a perspective view showing the detail of a 90 degree corner connection between the ends of metal wiring on the vertical slices and the metal pattern on the top surface of the assembled vertical slice stack of the present invention.

Details of the corner connections between slice surface wiring lines and the top metallization patterns are shown schematically in FIG. 2 which is a cut out and close up view of a portion of the top surface of the vertical slice assembly. Two interior slices 300 and 300' are shown for illustrative purposes and they are bonded to each other using an adhesive layer 600. Also shown are the top ends 410 of slice surface wiring (400 from FIG. 1) on the surface of slice 300' surrounded by adhesive 600. Top surface metal patterns 700 connect to slice surface wiring line ends 410 making 90 degree corner connections. Similar connections are also made to the other end of the slice surface wiring lines to bottom surface metal patterns not shown in FIG. 2. These top and bottom surface wiring patterns fan out to microjoints and C4 solder pads respectively in the final structure (shown in FIG. 1 but omitted in FIG. 2 for clarity).

Thus electrical interconnection is provided between the logic microprocessor chip 100 and the circuitry on the vertical slices 200 and 300 by means of microjoints 500 (of FIG. 1), top surface wiring 700 (of FIG. 2) and slice surface wiring 400. Delivery of power, ground and external input output signals to and from the logic microprocessor 100 and vertical slice circuitry are enabled by additionally using the bottom surface wiring pattern (not shown) and the C4 solder connections 900 to the package substrate (not shown).

Figure 3:
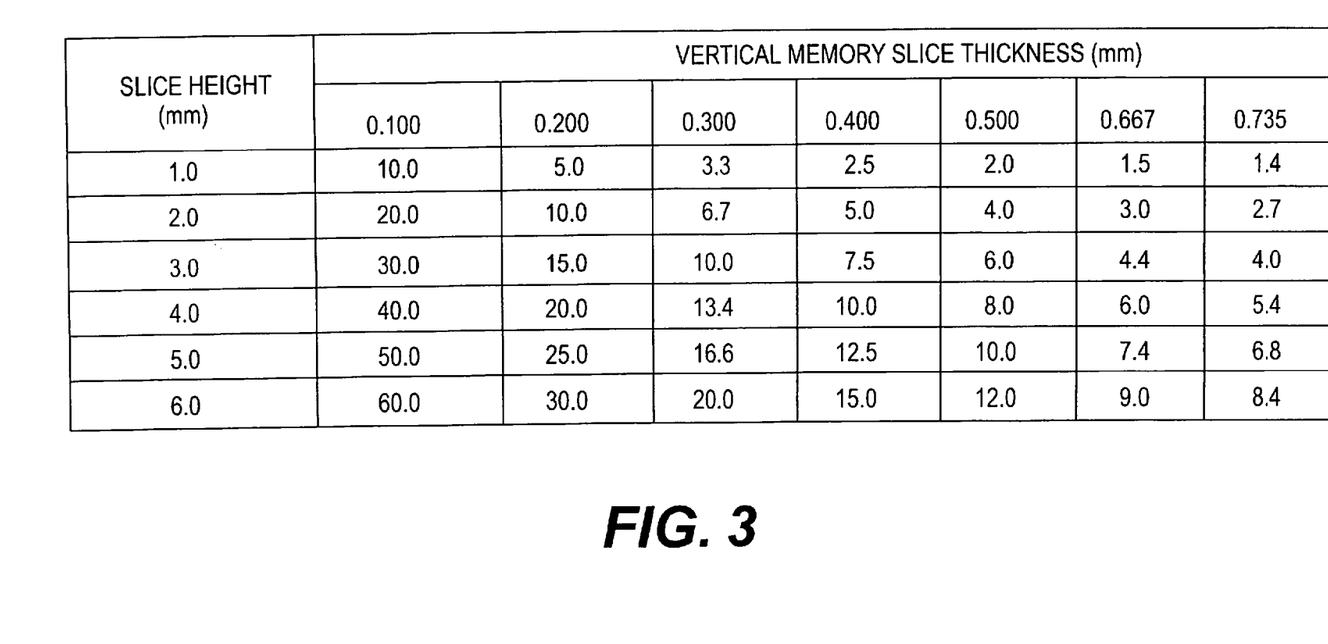
FIG. 3 comprises a chart of calculated data illustrating the effective area multiplier relative to a 2D memory achieved through the vertical memory slice stacked 4DI configuration of the type shown in FIG. 1 of the present invention.

Even though a single layer of slice surface wiring 400 is shown in FIG. 1 for simplicity of illustration, multiple wiring and via levels will be present on the active surface of the slice, some of which may be used as ground or power planes. To increase the area of the corner contact between top surface wiring 700 and the slice surface wiring, without increasing the corner crossing pitch, in the region of the contact 410 multiple wiring levels on the slices will be stacked and electrically connected together by vias. Also, the top surface wiring 700 is shown to extend slightly beyond the surfaces wires end 410 to allow for an electrical contact to be made to the surface wiring line ends 410 even if there is some variation in the slice 300 thickness which would cause the locations of the surface wiring line ends to vary slightly across the assembly of slices. Additionally, although the top surface wiring 700 is shown as a single wiring level, more complex interconnect schemes such as multilevel wiring comprising repeating combinations of a wiring level and an insulator coating with via contact openings filled with metal connecting to the wiring level, and terminating on top with a contact metal level suitable for connecting to microjoints 500 would also be used in 4DI assemblies as required. Similarly on the bottom side of the slice stack, a similar multilevel interconnect scheme terminating with a contact metal level suitable for connecting to C4 solder balls would most likely be used in 4DI assemblies, FIG. 3 is a summary of an exemplary calculation showing the memory density per unit foot print area of the logic microprocessor chip possible in the 4DI configuration expressed as a multiplier of a case where a single horizontally placed memory layer is bonded to the logic chip as in the case of a logic plus single memory bonded 3DI stack. Increased memory content and hence a higher multiplier is possible either by making the vertical slices thinner (0.735 mm is the typical thickness of a standard unthinned wafer) or by making the memory slices taller as shown in FIG. 3. To cite an example of how to use the information in FIG. 3, a 10× multiplier compared to a single 3D memory layer (or alternately stated an equivalence to 10 memory chips stacked on a logic chip using state of the art 3DI methods) is possible using 0.200 mm thick×2 mm high memory slices stacked vertically in the 4DI structure. Since no loss of silicon area due to TSV connections between the logic and the memory layer is assumed for the standard 3DI stack in this comparison, the multiplier is a highly conservative estimate of the enhancement afforded by the 4DI structure compared to 3DI structures with TSV's. Although, only a limited range of slice thickness and height values are shown in FIG. 3 it is understood that if processing and handling methods would allow, one could change these parameters to values beyond those shown in the table to achieve even higher multipliers than shown in FIG. 3 without deviating from the spirit of the present invention.

Figure 4:
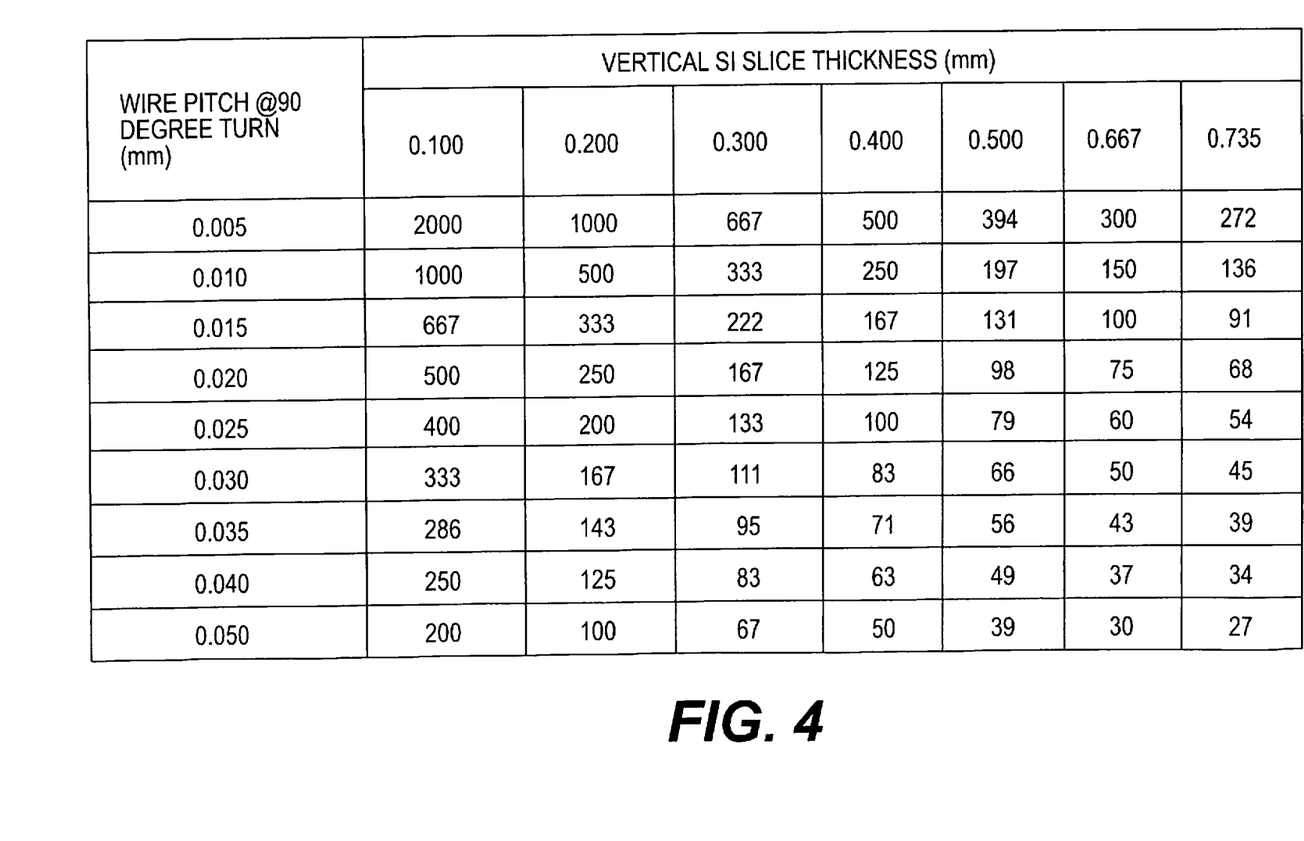
FIG. 4 comprises a chart of calculated data estimating the number of unique interconnections possible per square millimeter using the slice surface wiring and the 90 degree corner connection arrangement of the 4DI assembly of the present invention.

FIG. 4 illustrates the other important benefit of the 4DI configuration, namely the high communication bandwidth between the logic microprocessor 100 and the circuitry in the vertical memory slices 200 and 300 or package substrate. As the communication channels are provided by slice surface wires 400 which are fabricated using traditional thin film back end of the line (BEOL) processing on standard silicon wafers, they can potentially be fabricated at a much finer pitch compared to TSV's which are limited by processing and silicon thickness considerations as mentioned earlier. Further, using thinned vertical memory slices allows more memory slices with their associated slice surface wiring available close to the microprocessor circuitry in the logic chip 100. This is numerically illustrated in FIG. 4 where the number of unique logic to memory communication channels accessible per square mm of the logic chip foot print are shown for different memory slice thickness values and different line to line pitch for the slice surface wiring at the corner crossing to the top surface metal. As an example, using the table for a typical logic chip with a 400 sq. mm. foot print, using memory slices which are 0.200 mm thick, with a very relaxed ground rule slice surface wiring at 10 um pitch, a total of up to 200,000 unique communication lines would be possible between the logic processor and the associated memory bank located below the same. Some of these connections will need to be used for power, ground, and system input/output. One key benefit of the present inventive 4DI approach is that such memory density and memory access capability is achieved without the need for TSV's and the associated design and process complexities introduced. Memory cube approaches in the prior art some times invoke the vertical stacking of memory chips but they use memory access lines which are bused together and provided after the cube assembly and hence only allow a much lower interconnect density and hence do not enable the memory bandwidth possible in 4DI.

Figure 5:
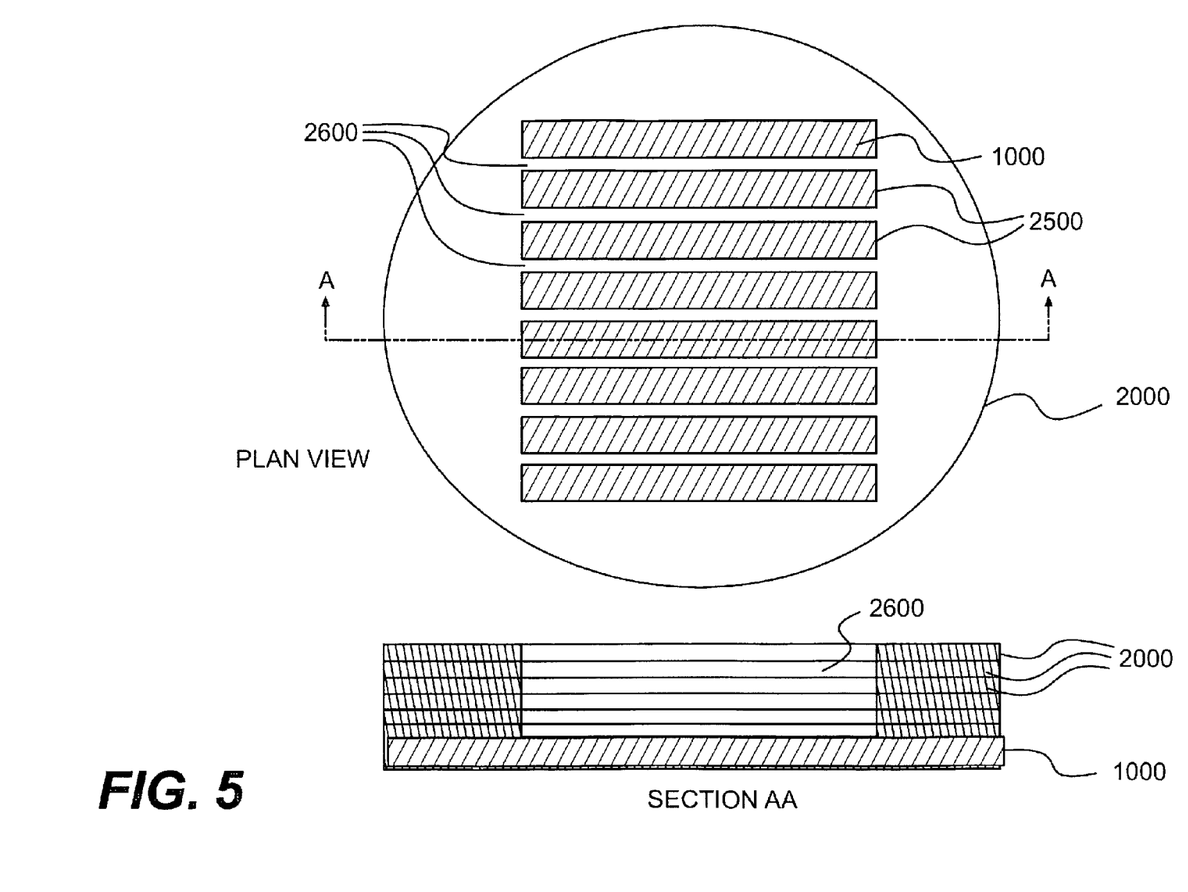
FIG. 5 comprises a plan view showing the inventive template assembly comprising a carrier wafer and several frame wafers of the present invention and a side elevation taken along the line A-A of the template assembly FIG. 6 comprises a flow chart illustrating the main steps in the fabrication of the carrier wafer, frame wafers and the steps to form the template assembly resulting in the structure of FIG. 5 of the present invention.
Figure 6:
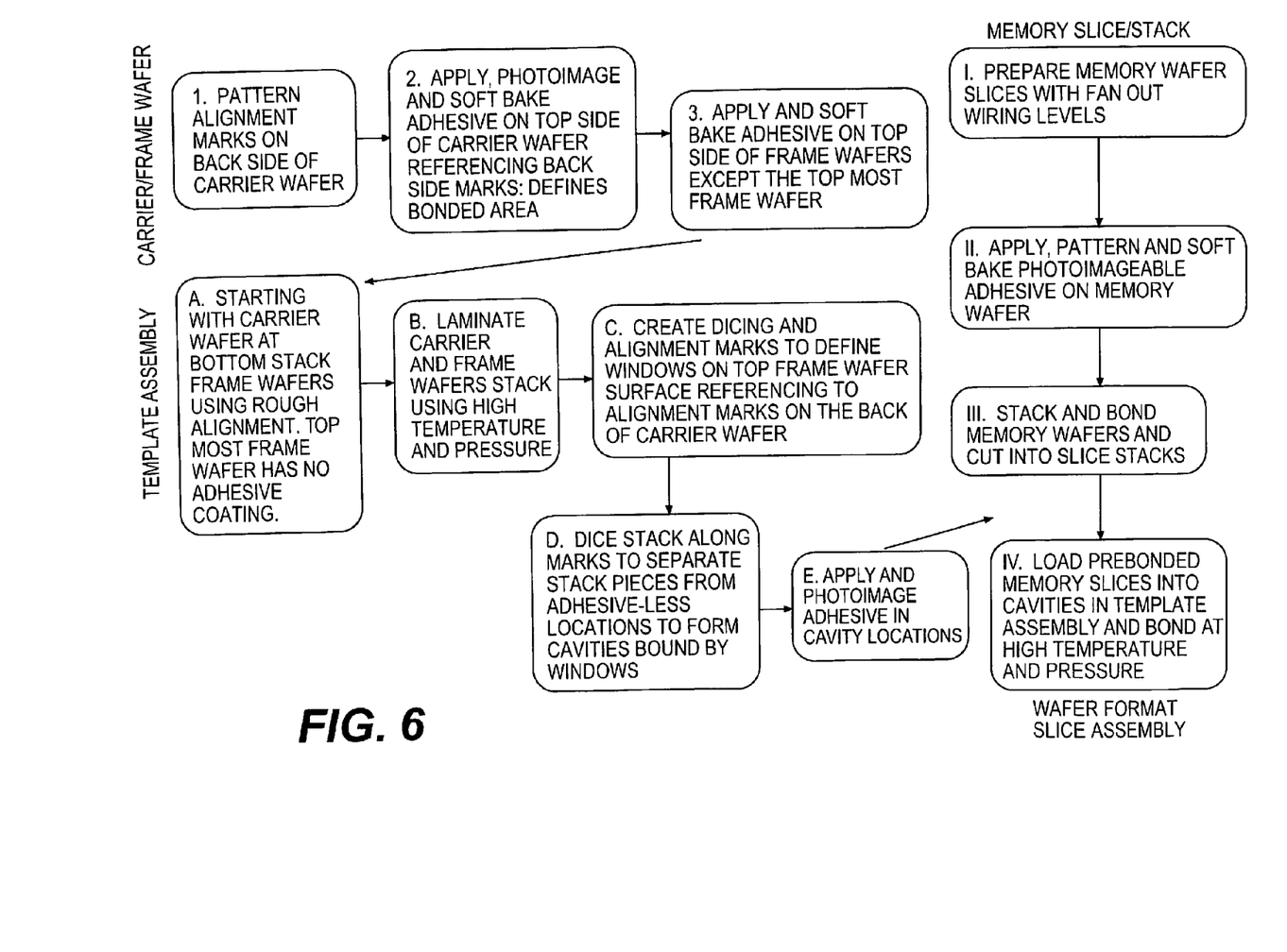
Figure 7:
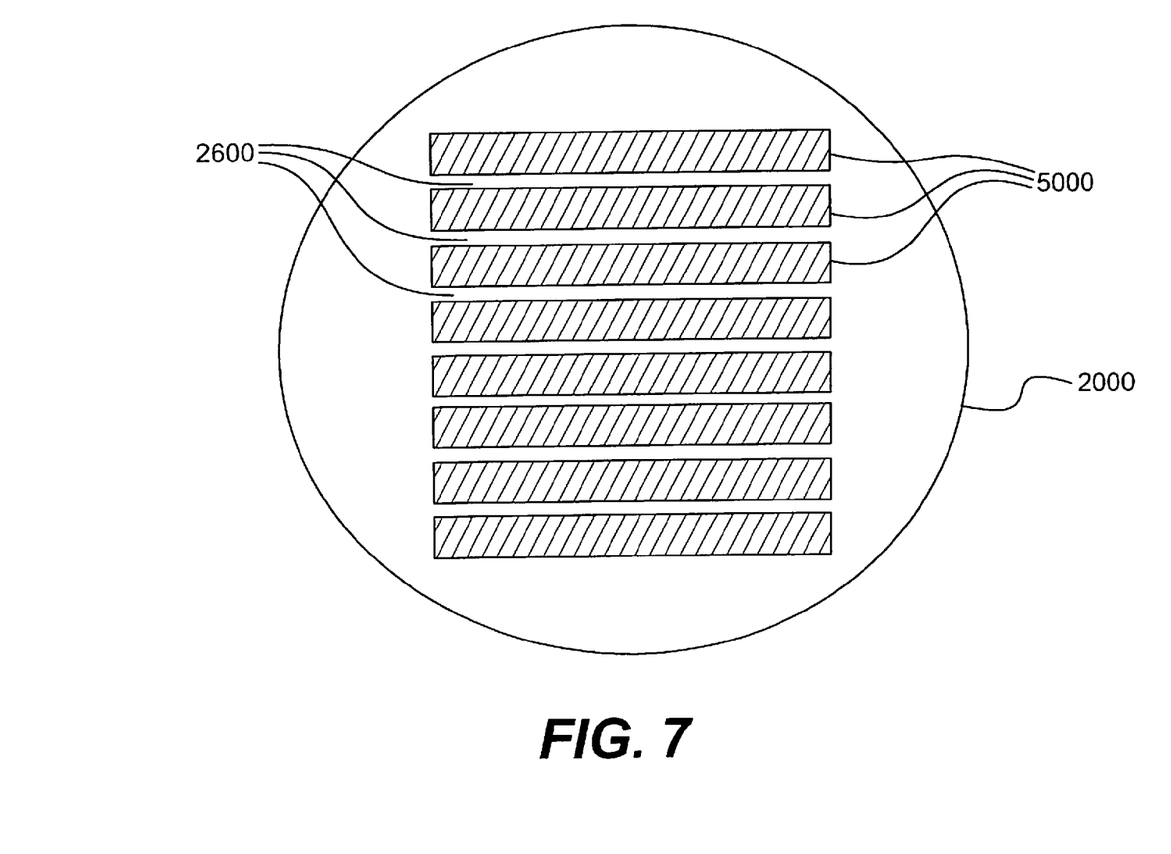
FIG. 7 comprises a plan view showing the assembled grouping of vertical wafer slices on a template assembly to achieve a wafer like substrate format enabling full wafer process tooling compatibility of the present invention.

FIG. 5 through 7 describe an inventive method that enables the assembly of numerous vertical device wafer slices into a wafer-type format on a carrier to facilitate ease of processing the vertical stack to form top and bottom surface wiring patterns and the like. The method uses some of the elements disclosed in United States Patent Application Docket YOR92009-0121US1 for post processing after the carrier/frame assembly and teaches additional unique features to facilitate full wafer-type processing of the slice stacks.

FIG. 5 shows a plan view and a sectional view of a template assembly comprising a carrier wafer 1000 and several frame wafers 2000. Frame wafers 2000 have windows 2500 cut out and separated by webs 2600. Several frame wafers are attached on the carrier wafer and to each other and windows 2500 are precisely located relative to the carrier wafer using back side alignment marks previously formed on the carrier wafer. The whole stack is bonded together using an adhesive layer disposed on each wafer leading to a template assembly shaped like a thick wafer with pockets at the locations of the windows 2500.

One inventive process flow for fabricating the template assembly shown in FIG. 5 and its use to then incorporate vertical device wafer slices is described schematically in the flow chart comprising FIG. 6. In the following description the vertical device wafers will be referred to as the memory wafers as these are the most common device wafers to be used in the 4DI assembly. It should be noted that other types of device wafers can be similarly processed into vertical stacks and incorporated into 4DI assemblies and the descriptions below would apply in a general manner to all these cases without deviating from the spirit of the inventive method described.

The process flow of FIG. 6 comprises multiple blocks containing specific process sequences performed on the frame wafers, carrier wafer and the memory wafers and making a template assembly and the wafer format slice assembly.

Blocks 1 and 2 describe the process steps performed to create the carrier wafer 1000. In the sequence contained in block 1, silicon wafers are processed to create suitable reference alignment marks on their back surfaces. Such marks can be made of metal features, etched into deposited or grown insulators such as silicon oxide or nitride, or simply etched as a cavity into the silicon surface itself.

In process block 2, a photoimageable adhesive is applied on the top surface of the carrier wafer 1000 and photopatterned using standard photolithographic methods and by locating the pattern precisely on the top surface using as reference the back side alignment marks previously formed on the wafer, Double sided lithography tools known in the art such as MA-8 manufactured by Suss Microtec Inc. can be used to form the necessary photopatterns for using such back aligned marks. The patterning of the adhesive is done such that there is no adhesive in the locations corresponding to where the windows of the frame wafers will be located in the final assembly. The purpose for this particular pattern will be explained subsequently. The photoimaged adhesive is preferably baked at some intermediate temperature such that it is tack free and substantially free of residual solvents and yet pliable and conducive for bonding later. Typically 150C for 15 minutes is an adequate baking process but any suitable temperature that precludes the significant onset of cross linking and setting of the adhesive and yet removes residual solvents is acceptable. Typical adhesives suitable for this use are photosensitive polyimides such as HD-4004 manufactured by HD Microsystems Inc. These afford good bonding characteristics and stability to 400C for post bonding process steps required for the 4DI process. Blocks 1 and 2 complete the processing required to form the carrier wafer 1000

Block 3 describes the flow required to form a frame wafer. Many frame wafers will be required to form a template assembly as shown in FIG. 5. In block 3 an adhesive is applied, and soft baked on the front side of frame wafers. Photopatterning is not required but can optionally be used to create vent channels free of adhesive which can help the escape of any outgased species during subsequent lamination step. Also it should be noted that some frame wafers are not provided with any adhesive coating and these will be used in assemblies as the top most frame wafer as described later.

Process blocks A through D describe the steps required to assemble frame wafers and a carrier wafer to produce a template assembly. In process block A, the carrier wafer is placed face up and a frame wafer is placed facing up on it in rough alignment using mechanical means such as alignment of the wafer notches. Additional frame wafers with adhesive coating are stacked in the same fashion finishing the stack with a frame wafer with no adhesive coating as the top most wafer in the stack. The total thickness of the frame wafer stack is targeted to be equal to the height of memory wafer slices to be produced in process block I as will be described later. In process block B, the stack of carrier and frame wafers is subjected to high temperature and pressure to laminate them together using the adhesive layers provided on their surfaces. Lamination temperature is chosen to be above the point where the adhesive is able to flow and fill any gaps between the wafers and to cross link and set into a permanent bonding layer. Typically a temperature between 300 and 400C and a pressure of about 100 to 300 psi are suitable for this purpose. Isostatic lamination using gas bladders to exert uniform pressure on the stack is preferred although parallel plate lamination presses could also be used.

In process block C, windows are created in the frame wafers in the laminated structure. It should be recalled that the adhesive was expressly excluded on the front side of the carrier wafer at the areas where the windows in the frame wafers are expected to be present, and hence only the remaining areas are bonded together between the carrier wafer and the lowest wafer in the frame wafer stack. Next, dicing marks that define the outline of the windows are formed on top of the top most frame wafer referencing the patterns with respect to the back side alignment marks provided on the carrier wafer. This enables the location of the boundaries of these windows in precise registration to the adhesive free areas provided on the front side of the carrier wafer.

In process block D, cuts are made into the stack along the boundaries defining the windows going all the way through all the frame wafers and a little depth into the carrier wafer. These cuts can be made with a wafer dicing saw or a wire saw where the depth of the cut can be controlled to micron type accuracy. When such cuts are made, the portions of the frame wafers corresponding to the window areas where there is no adhesive present on the carrier wafer get released and can be removed (as the bottom most frame wafer is not adhered to the carrier in these areas) while the remaining area of the frame wafers including the webs 2600 stay adhered in the template assembly. In block E of processing, a photosensitive adhesive is again applied but this time dispensed or patterned to be present only in the window/cavity areas 2500 of the template assembly. Alternately, a non-photosensitive adhesive could be selectively applied in the window/cavity areas 2500 by a method such as spraying through a contact metal mask or screening through a stencil with appropriate window openings. The final structure has this final adhesive present only on the carrier wafer top surface and only in the window/cavity areas 2500. The resulting structure would be the template assembly shown in FIG. 5.

Next in process block I, memory slices are created starting with memory wafers and providing them with top surface fan out wiring connecting to the various memory circuits contained within. As mentioned earlier, multiple interconnect levels with wiring and vias could be utilized to accomplish this result. In block II, they are coated and soft baked with photosensitive adhesive which is patterned to be excluded from the dicing channels along which the wafers will be diced into slices subsequently. In block III these wafers are stacked together, laminated and then diced into slice stacks. Alternately, one could first dice the adhesive coated memory wafers into long slices and then laminate the slices together to form the slice stack. In either case, the number of slices in the final stack and hence the stack thickness is chosen such that the stack will snugly fit into the cavities 2500 in the template assembly from Block E, when the slice stack is tipped such that the fan out metal patterned faces are oriented in the vertical direction.

In process block IV, the prebonded slice stacks (5000 shown in FIG. 7) are loaded into the cavities in the specific orientation described earlier. The whole structure is then subjected to isostatic lamination such that slice stacks are well bonded to the carrier wafer by the adhesive present on the surface of the carrier wafer in the pocket areas and fully confined within the cavities 2500 resulting in the structure shown schematically in FIG. 7. This structure, comprising the carrier wafer 1000 (hidden underneath in the plan view of FIG. 7), frame wafers 2000 with vertical slice stacks 5000 located within pockets in frame wafers 2000 separated by webs 2600 is designated as the wafer format slice assembly 6000 and resembles a thick silicon wafer. It is conducive to wafer format processing to be performed on all the slice stack groups (5000) en masse using semiconductor wafer or packaging manufacturing tools currently known in the art. This substrate format enables efficient processing of multiple slice stacks in one pass without concerns regarding handling of fragile slices or cubes with non-standard substrate sizes. Thus the quality and feature size of patterns which can be fabricated atop such a wafer format slice assembly is far superior to those possible when individual slices or slice stacks or cubes are processed as in the prior art.

Subsequent processing steps described in application YOR9-2009-0121 can now be performed on this wafer format slice assembly conveniently. An exemplary sequence as described in the above application and added here for the sake of completion would include: grinding and polishing of the slice stacks to expose the ends 410 of the fan out wiring 400 (see 400 in FIGS. 1 and 410 in FIG. 2) on the faces of the memory slices; recessing the silicon around the wire ends; depositing and planarizing a layer of dielectric such as silicon oxide or nitride to provide electrical isolation; and depositing and patterning top surface metal pattern (700 of FIG. 2) to make corner connections to slice surface wiring ends (410 of FIG. 2). Metal contact pads for enabling microjoint connections to logic chip are also formed as part of the top surface metal pattern (700 of FIG. 2). These pads can be made to extend slightly beyond the surface wiring ends 410 s shown to allow for tolerances in the slice thickness and adhesive layer thickness as mentioned earlier. Additionally, more complex interconnect schemes such as multilevel wiring comprising repeating combinations of a wiring level and an insulator coating with via contact openings filled with metal connecting to the wiring level, and terminating on top with a contact metal level suitable for connecting to microjoints 500 could also be used in such 4DI assemblies as required.

At this point, a handle substrate is attached to the processed top side of the wafer format slice assembly. The structure is flipped over and the carrier wafer is ground or etched away fully and the back side of the slice assembly is ground and polished to expose the bottom ends of slice surface wiring. Back side metal patterns to make corner connections with the bottom ends of slice surface wires, which can include a wiring level, insulator layer with metal filled via contacts connecting to the wiring level and a suitable contact pad metallurgy located on the insulator to support solder and finally C4 solder balls (900 in FIG. 1) are then formed on this surface. Typically the interconnect wiring and via levels utilize conductive metals such as copper, aluminum or alloys thereof. Contact pads to support solder in C4 balls or solder microjoints typically comprise a stack made of metals selected from copper, nickel, cobalt, titanium, palladium, platinum and gold with the noble metals being on top to provide wetability of solder and the other metals provided below the noble metal to enable solder reaction barrier function. The structure is then diced through the slice stack and the handle wafer into coupons that are the same size as the logic processor chip. The structure is then mounted on to a packaging substrate by means of the array of C4 solder balls 900. The section of the handle wafer still attached on the top side can then be removed from this structure by grinding or laser release methods known in the art. The logic processor chip 100 with microjoint metal, 500 in FIG. 1, is then attached to the exposed top surface metal patterns on the memory slice stack coupon completing the 4DI structure shown in FIG. 1 which would in this case be mounted on a packaging substrate (not shown in FIG. 1).

Microjoint metal 500 in this flow would be a solder and a reflow joining process is utilized to achieve this connection. Alternate joining methods for attaching the processor chip to the memory slice assembly such as transfer and joining (TJ) described in YOR9-2009-0121US1 can also be used. These methods would require copper to copper or gold to gold bonding supplemented by an adhesive layer for additional bond strength. In this case, the processor chips may be attached in lieu of the handle wafer in the above flow using the TJ method first and can be left in place for the remaining process steps mentioned above. Handle wafer attach, removal as well the solder microjoint formation will not be required in this case.

Figure 8:
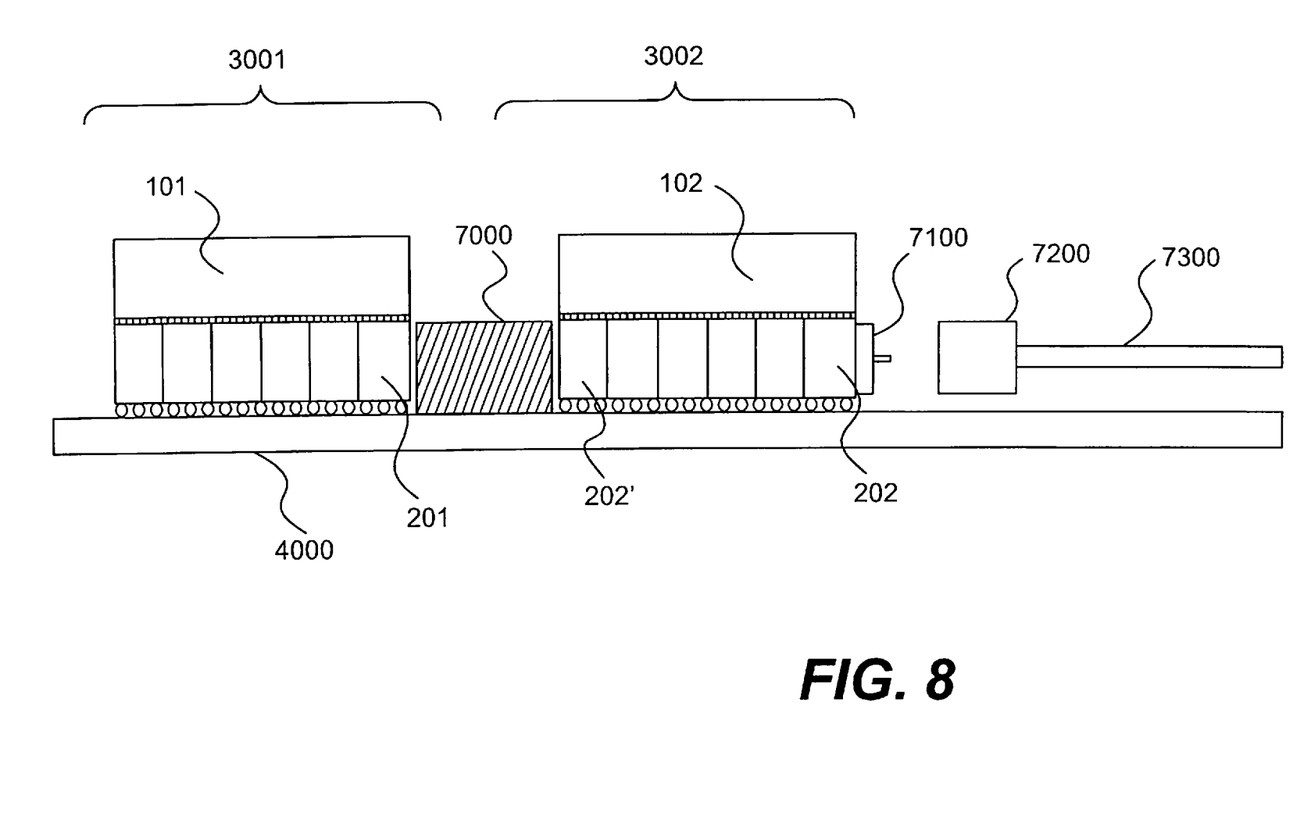
FIG. 8 comprises a side elevation in cross section of a system of the present invention comprising multiple 4DI modules mounted on a packaging substrate, each 4DI module being provided with optoelectronic devices for sending and receiving optical signals and for electro-optic conversion located on the end faces of their vertical slice assembly to enable optical communication between the logic processor chips in the adjacent 4DI modules or by a optical fiber ribbon to 4DI modules located on a different packaging substrate.

The 4DI structure with vertical slice assembly shown in FIG. 1 can be used advantageously to enable other functional capability in the modules. One exemplary depiction of a specific embodiment is shown in FIG. 8. FIG. 8 shows an elevation view of two 4DI modules 3001 and 3002 mounted on a package substrate 4000. 4DI modules 3001 and 3002 are particular embodiments of the module shown in FIG. 1 and incorporate optoelectronic devices in the two end slices of the vertical stack. These devices include but are not limited to light emitting laser VCSEL (vertical cavity surface emitting laser) elements, drive circuits to operate the VCSELS, optical transmitter and receiver elements, electro-optic modulating circuits, electro-optic conversion circuits, optical focusing/collimating elements, devices for aligning or coupling into optical fiber connectors, optical wave guides, photodetectors, and the like. These slices are also provided with the corner connections to the processor chip and the C4 balls as in the case of the memory only slices which comprise the interior slices in the stack. These end slices are positioned in the stack with their active device surface facing outwards. The end slice in each module is designed to communicate with the processor chip above and receive electrical signals which are converted by the devices in the end slice to optical signals as well as convert any received optical signals back to electrical signals for sending back to the processor chip above.

These optical signals (photons of laser energy) are emitted outward from the slice surface and are then either coupled into an optical transfer device 7000 or a ribbon fiber coupling device 7100. If the gap between 4DI modules 3001 and 3002 is sufficiently small and the alignment between the light emission devices on one 4DI module and the photon detecting devices on the facing 4DI module is good enough, an optical transfer device 7000 may not be required. If these conditions are not met and an optical transfer device 7000 is required, then appropriate optical elements can be used to expand and collimate the emitted light, and then focus it onto the photo detecting device. Alternatively, a device which limits the divergence of the emitted light such as a fused fiber bundle, or suitable wave guide, can 7000 serves to improve the coupling of the emitted light to the photon detecting devices and to reduce the cross talk between adjacent 7100, such as an MT ferrule, is aligned & optically coupled to and optical end slice 202. Note that the ribbon fiber coupling device 7100 can be mechanically attached to the end slice 202, as shown, or additionally to the substrate 4000, or to both (not shown). An optical fiber ribbon 7300 which is terminated with a mating ribbon fiber coupling device 7200, such as an MT ferrule, is shown in FIG. 8, not connected to, but adjacent to ribbon fiber coupling device 7100.

It is advantageous to integrate the optical communications device as close to the processor chip as possible to enable a high data rate, high total data bandwidth, and reduced power consumption. If the optical communications device is mounted on the package substrate 4000, a significant number of the C4 balls 900 may be required to carry the electrical signals and the power consumed moving the data to and from the optical communications device would be increased.

In the configuration described above, an electrical signal from processor chip 101 is sent to end slice 201 where it is converted to an optical signal and emitted outwards to the right. The optical signal emanating from end slice 201 in module 3001 is directed to and received by the receiving end slice 202' of the 4DI module 3002. Appropriate devices in slice 202' convert the optical signal to electrical signals and communicate the same to the processor chip 102 mounted thereon. Thus communication between processor chips 101 and 102 are enabled using circuitry contained within 4DI modules 3001 and 3002 without using any input output C4 connections or electrical pathways in the package substrate 4000. As optical data communication accommodates a large band width and is free of signal distortions, delays and losses associated with long electrical communication means through a packaging substrate, this arrangement can enable very large bandwidth data transfer at a high fidelity between neighboring 4DI modules in a system ensemble and reduce the communication load required through the package substrate 4000.

Although the configuration and communication methodology is illustrated above using just two modules, it is clear that it can be extended to more such modules located in a linear arrangement on a common substrate. Such a methodology would be highly conducive to building computing systems wherein 4DI modules are organized into well coordinated parallel computing engines optimized to solve unique problems requiring large data transfer rates between modules. In similar fashion, using ribbon fiber coupling device 7100, 4DI modules located on different package substrates 4000, different system boards, or in different racks (details not shown in Figures) can be optically interconnected as well.

Thus, in one embodiment of our invention we provide a computing system comprising at least two of 4DI modules arranged adjacent to each other on a packaging substrate, the at least two of 4D1 modules further comprising a logic microprocessor chip attached to a group of vertical device wafer slices, the group further comprising end slices made from optoelectronic device wafers and interior slices made from memory wafer slices such that data exchange between the at least two 4DI modules is performed using optical communication means employing the optoelectronic devices in the end slices.

Another embodiment of our invention comprises a system according to paragraph [0056.1] further comprising optical coupling means such as collimators, fiber bundles to improve the optical coupling between the adjacent 4D1 modules on the packaging substrate as well as to enable optical coupling between 4D1 modules on a plurality of the packaging substrates.

Throughout this specification, abstract of the disclosure, and in the drawings, the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" in any claim or as applied to any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, wherein "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including Internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Applicants reserve the right to amend this specification and the drawings filed herein without prejudice or disclaimer and in doing so, they do not disclaim, abandon, or forfeit any invention directly or indirectly represented thereby, and hereby rescind any implied disclaimer that may be inferred from applicants' amendments or cancellation in the course of prosecution of this or any parent, continuation, continuing, continuation in part, divisional, terminally disclaimed, or foreign patent application (related patent application or applications), and specifically preserve all and any inventions embodied not only by the original claims but also the written description, abstract of the disclosure, and drawings of this application and any related patent application or applications, and preserve the right to prosecute claims to these inventions in any related patent application or applications filed prior to or subsequent to the filing of this application.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A computing system comprising at least two of 4DI modules arranged adjacent to each other on a packaging substrate, said at least two of 4DI modules further comprising a logic microprocessor chip attached to a group of vertical device wafer slices, said group further comprising end slices made from optoelectronic device wafers and interior slices made from memory wafer slices such that data exchange between said at least two 4DI modules is performed using optical communication means employing said optoelectronic devices in said end slices.

2. A system according to claim 1 further comprising optical coupling means such as collimators. fiber bundles to improve the optical coupling between said adjacent 4DI modules on said packaging substrate as well as enable optical coupling between 4DI modules on a plurality of said packaging substrates.

* * * * *